United States Patent [19]
Lee

[11] Patent Number: 5,724,037
[45] Date of Patent: Mar. 3, 1998

[54] DATA ACQUISITION SYSTEM FOR COMPUTED TOMOGRAPHY SCANNING AND RELATED APPLICATIONS

[75] Inventor: Wai L. Lee, Wilmington, Mass.

[73] Assignee: Analog Devices, Inc., Norwood, Mass.

[21] Appl. No.: 447,735

[22] Filed: May 23, 1995

[51] Int. Cl.$^6$ .................................................. H03M 3/00
[52] U.S. Cl. .......................... 341/143; 341/155; 378/19
[58] Field of Search .......................... 341/143, 61, 155; 364/724.1; 378/19

[56] References Cited

U.S. PATENT DOCUMENTS

| | | | |
|---|---|---|---|
| 4,246,571 | 1/1981 | Gariazzo | 340/347 |
| 4,905,005 | 2/1990 | Arribard et al. | 341/139 |
| 4,937,577 | 6/1990 | Rich et al. | 341/143 |
| 5,142,286 | 8/1992 | Ribner et al. | 341/143 |
| 5,497,152 | 3/1996 | Wilson et al. | 341/61 |

OTHER PUBLICATIONS

"Designer's Reference Manual", Analog Devices Inc., Norwood, MA, 1996; Section 2, pp. 43–44 and 103–104.

*Primary Examiner*—Jeffrey A. Gaffin
*Assistant Examiner*—Thuy-Trang N. Huynh
*Attorney, Agent, or Firm*—Wolf, Greenfield & Sacks, P.C.

[57] ABSTRACT

A computed tomography imaging method includes receiving an analog beam intensity signal from a computed tomography scanner and converting the signal into a series of digital representations of the signal at successive points in time using a predetermined sample rate. Indications that a portion of the scanner has reached a certain position relative to the beam are received asynchronously with respect to the sample rate. The value of at least one of the digital representations is adjusted in response to the indications to obtain a corrected digital representation of the analog signal.

37 Claims, 6 Drawing Sheets

DATA ACQUISITION SYSTEM FOR COMPUTED TOMOGRAPHY SCANNING AND RELATED APPLICATIONS

This application is related to two commonly assigned copending applications, respectively entitled MULTI-RATE IIR DECIMATION AND INTERPOLATION FILTERS to Wai Lee and Tom Kwan and SWITCHED CAPACITOR OFFSET SUPPRESSION to Wai Lee, both filed on the same day as this application and herein incorporated by reference.

FIELD OF THE INVENTION

This invention relates generally to analog-to-digital conversion, and in particular to such conversion in sigma-delta modulated data acquisition systems suitable for use in computed tomography.

BACKGROUND OF THE INVENTION

Computed tomography (CT) is an imaging technique that can produce cross-sectional images of a patient or an object. Health care professionals use it widely to obtain diagnostic images of their patients. It also has applications in non-destructive industrial testing of solid objects.

CT-scanners generally operate by taking a series of one-dimensional X-ray images of a patient and combining digital versions of them in such a way as to obtain a cross-sectional image of the patient. They can do this using a motor-driven carriage that rotates around the patient with an X-ray source and a series of detectors mounted on it. An acquisition system converts analog signals produced by the detectors during scanning into digital signals that can then be processed by computers using well-known tomographic methods.

Minimizing patient x-ray exposure in a CT-scanner is of paramount importance. Reducing scan time is also desirable because it allows the system to be used for more patients, and therefore tends to reduce diagnostic costs. These considerations generally require that the acquisition system convert the analog signals quickly.

Other design variables include the maximum intensity of the chosen x-ray source, the system's spacing of detectors, the speed of its scan, the diameter of its carriage, and the type of system. Some types of systems employ stationary detectors surrounding part or all of the carriage. Others, such as the motor-driven system mentioned above, place the detectors on the carriage over a quarter to a third of its radius.

Some CT systems also feature three-dimensional imaging. These systems perform three-dimensional imaging using either a series of scans at successive adjacent planes, or a single spiral scan. In a spiral scan, the system slowly advances the patient through the carriage as it rotates around him or her, and this can take a minute or more. Some systems also feature variable scanning rates, with slower scans yielding clearer pictures. Manufacturers have used different combinations of design variables, system types, and features in their systems.

The resulting worst case data rates that the data acquisition system must process are generally around the order of 2.5 thousand complete images per second, but rates as high as 10 thousand or more images per second are used in some systems. And a system may have on the order of 1000 or more detectors, which each need a data acquisition channel able to process data at this rate. Furthermore, in the case of three-dimensional imaging, the output signal values of this circuitry must not drift excessively during a minute or more of scanning.

CT scanning data acquisition systems have employed multiplexed gain ranging or floating point analog-to-digital converters. More recently, the use of sigma-delta converters has been proposed. Sigma-delta converters generally include a modulator, which converts the analog input signal into an oversampled serial stream of ones and zeroes with reduced effective quantization noise at low frequencies. They then employ a digital low pass filter to filter out the quantization noise at higher frequencies and to remove the redundant signal information introduced by the oversampling process in the modulator. Higher order modulators tend to be better at moving quantization noise out of the lower frequencies, but these modulators are more likely to be unstable. Sigma-delta converters are described in more detail in *Mixed-Signal Design Seminar* published by Analog Devices, Inc., Norwood, Mass., 1991.

U.S. Pat. No. 5,142,286 to Ribner et al. presents one such system. This system uses cascaded second and first order sigma-delta modulators. Another proposed system uses a current-based fifth order sigma-delta converter. Neither of these systems generally provides an optimum solution for converting analog signals from a CT scanner in terms of both noise reduction and the amount of required circuitry.

SUMMARY OF THE INVENTION

In one general aspect, the invention features a computed tomography imaging method that includes receiving an analog beam intensity signal from a computed tomography scanner and converting it into a series of digital representations at successive points in time. An indication that a portion of the scanner has reached a certain position relative to the beam is received asynchronously with respect to these points in time, and the value of at least one of the digital representations is adjusted in response to the indication to obtain a corrected digital representation of the analog signal.

The converting can employ a variable length conversion interval, with value of the one of the digital representations being adjusted based on a length of the interval. The method can also initiate and terminate decimating in response to steps of receiving, or it can inlcude overlaping decimating steps. The steps of decimating can simultaneously respond to a weighting value to determine a coefficient to be applied to a modulated version of the signal. The adjusting can include linearly interpolating between two of the digital representations to obtain the corrected digital representation. The converting can employ an infinite impulse response filter.

In another general aspect, the invention features a computed tomography scanning system that includes sigma-delta modulators operatively connected to x-ray detectors, and decimator portions that each include an accumulator with an add/subtract line operatively connected to one of the modulators. A coeffcient source has a coefficient output operatively connected to a data input of each of these accumulators. A digital signal processing stage is responsive to the decimator portions, and a display is responsive to the digital signal processing stage.

The decimator portions can be part of a single semiconductor structure. The coeffcient source can include a read-only memory. The decimator portions can have a rectangular time domain response with rounded rising and falling ends, with the rounded ends being axially symmetrical, as well as a response that is the result of a convolution of a sinc function with a low pass function. The coeffcient source can be operatively connected to a second accumulator, and a multiplexer can be operatively connected to the accumulators. A toggle flip-flop can be operatively connected to a convert signal input and a select input of the multiplexer.

In a further general aspect, the invention features an analog-to-digital converter that includes a sigma-delta modulator, a convert signal line, a decimator with a variable decimation ratio operatively connected to the modulator and the convert signal line, and a decimation period timer operatively connected to the convert signal line. The modulator can be a third-order sigma-delta modulator.

In another general aspect, the invention features a computed tomography scanning system that includes sigma-delta modulators each responsive to an x-ray detector, a convert signal line, and variable decimation ratio decimators each operatively connected to one of the modulators and the convert signal line. The system also includes a decimation period timer operatively connected to the convert signal line, a digital signal processing stage responsive to the decimators and the timer, and a display that is responsive to the digital signal processing stage.

In a further general aspect, the invention features a computed tomography imaging method that includes sigma-delta modulating an analog beam intensity signal to obtain a modulated version of the signal, and decimating it according to a rectangular time domain response with rounded rising and falling ends, which can be axially symmetrical. The method can also include another step of decimating that lasts a different amount of time, and/or another step of decimating that overlaps the step of decimating.

In another general aspect, the invention features a computed tomography imaging method that includes transresistance preamplifying a current from a detector in a computed tomography scanner, modulating the output with a third-order sigma-delta modulator, and decimating the oversampled output from the step of modulating. The current can be derived from exposure of a patient to X-rays. The modulating can be unstable when the output voltage is above a certain level, and the voltage can be limited to that level.

In a further general aspect, the invention features a method of analog-to-digital conversion that includes actively deriving a first voltage from an analog current signal, dividing the first voltage down into a second voltage, and converting the second voltage into a digital output.

In another general aspect, the invention features an analog-to-digital converter that includes a transimpedance amplifier with a current input and a voltage output, a conversion circuit responsive to the output, and a voltage divider between the amplifier and the conversion circuit.

The conversion circuit can be a modulator, such as a third order sigma-delta modulator, and the divider can be a resistive divider, such as a thin-film, on-chip divider. The amplifier, the divider, and the conversion circuit can be part of a single semiconductor structure. The amplifier and conversion circuit can operate from different supply voltages. The dividing ratio can be large enough to prevent a voltage at the input of the modulator from exceeding a predetermined maximum input signal range of the modulator, when the transresistance amplifier supplies the maximum output voltage. The amplifier can include an operational amplifier coupled with a feedback resistor, which can be above at least 10 megaohms in resistance. Converters of this type can be used in a computed tomography scanning system.

Embodiments according to the present invention are advantageous in that they can provide for improved analog-to-digital conversion of CT scanning signals, such as improved signal-to-noise performance and/or reduced circuitry requirements for a given performance level. Increases in signal-to-noise ratio can be obtained from improved preamplifier circuitry, from improved decimation characteristics, and from voltage-limited circuitry that permits that use of a third order sigma-delta modulator. Reduced circuitry requirements can be obtained from improvements in the decimator, such as by the use of a single filter ROM and other components shared between channels and phases, and by an improved filtering characteristic that allows conversion synchronized to a convert signal that tends to jitter due to factors such as motor speed variation. Embodiments according to the invention may therefore permit design of more accurate and/or less costly CT scanning systems.

DETAILED DESCRIPTION

Figure 1:
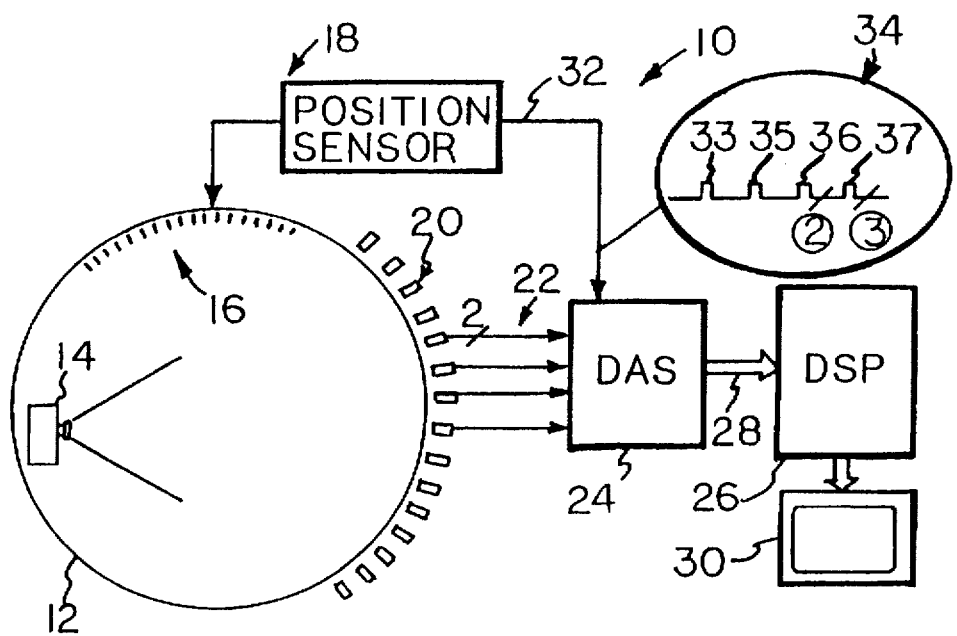
FIG. 1 is a block diagram of a CT scanning system according to the invention.

Referring to FIG. 1, a computed tomography scanning (CT scanning) system 10 incorporating circuitry according to the invention includes a circular carriage 12 that supports an x-ray source 14, in such a way that the carriage and x-ray source can be rotated together around the patient (not shown). The carriage bears regularly spaced tick marks 16, which can be placed along its circumference. A series of detectors 20 also sit on the circumference of the carriage at regular intervals. Each of these detectors includes a scintillating crystal, which emits infrared light when exposed to x-rays. Coupled with the crystal is a photo-diode, which is sensitive to the emitted light. This compound structure generates a differential current signal in response to x-ray intensity. A pair of detector signal lines 22 provide the differential current signal to a data acquisition system (DAS) 24. The data acquisition system also receives a convert signal 34 on a convert line 32 from a position sensor 18, which interacts with the tick marks 16 on the carriage 12.

To obtain a diagnostic image of the patient, the system 10 begins by supplying power to the x-ray source 14 and rotating the carriage 12 around the patient. As the carriage rotates, the position sensor 18 successively detects each of the tick marks 16 and provides corresponding pulses 33, 35, 36, 38 in the convert signal 34. These pulses delimit conversion intervals, during which the data acquisition system 24 translates the current signals from all of the detectors into corresponding digital intensity values. The data acquisition system provides these digital values on its digital output 28 to a digital signal processing (DSP) system 26.

The digital signal processing system 26 uses the digital values from the data acquisition system 24 to digitally reconstruct and filter a cross-sectional image of the patient in the plane of the carriage 12. The system then displays the image to the user on a display 30. The digital signal processing system typically includes dedicated digital signal processing circuitry that can quickly perform convolution operations for the digital reconstruction and filtering of the image. Dedicated digital signal processing integrated circuits, such as the ADSP21060, available from Analog Devices, Inc. of Norwood, Mass., are well suited to this task.

Figure 2:
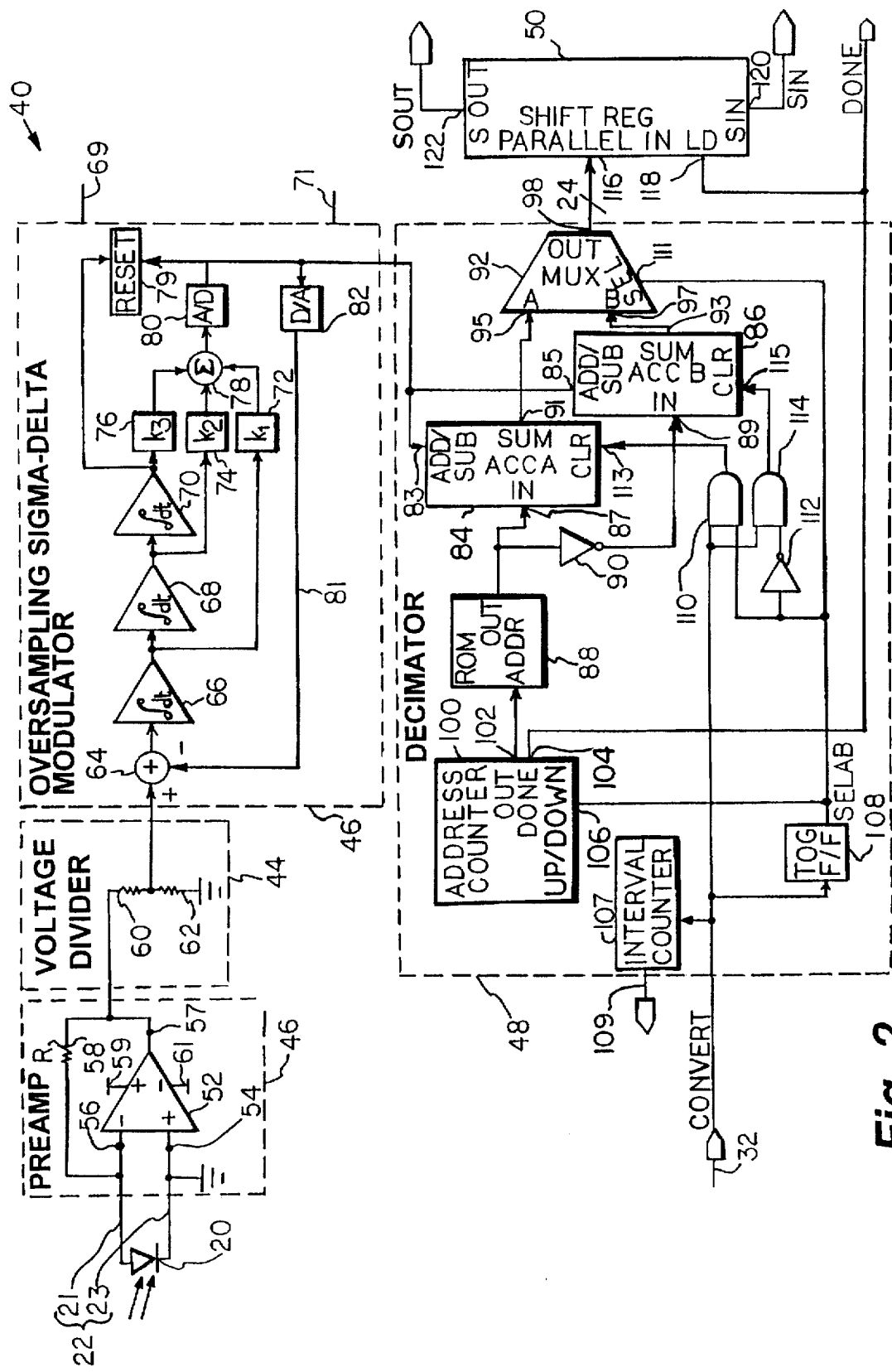
FIG. 2 is a block diagram of an integrating mode data acquisition channel for the system of FIG. 1.

Referring to FIG. 2, each data acquisition channel 40 in the data acquisition system will interface with one of a series of pairs of detector signal lines, which each provide an analog signal. The data acquisition system also interfaces with the convert line 32, which provides the digital convert signal 34. The data acquisition system provides a digital output in a format that allows it to be quickly stored in a general purpose computer. Of course, different manufacturers may provide somewhat different interfaces to the data acquisition system, but such variations are well within the comprehension of one skilled in the art. CT scanning systems are available from various manufacturers, and BIR, Inc., of Lincolnshire, Ill. offers consulting services in the area of CT scanning.

Figure 3:
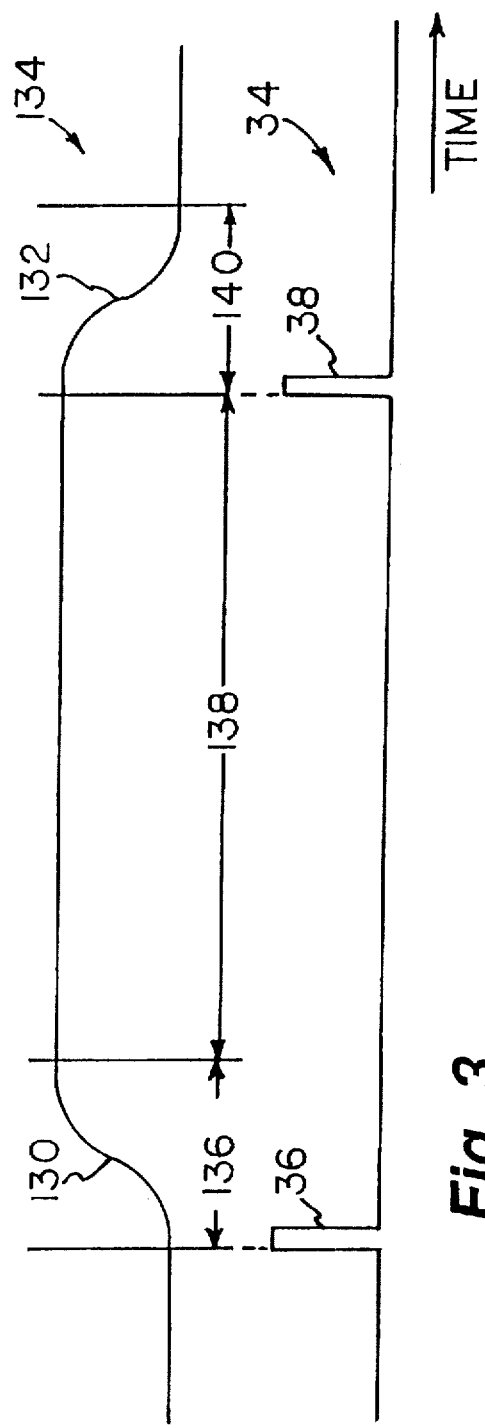
FIG. 3 is an illustrative timing diagram showing the two successive exemplary convert pulses from the CT scanning position sensor delineated by 3—3 in FIG. 1, in alignment with a time domain response plot of the decimator in the data acquisition channel of FIG. 2.

Referring to FIGS. 1–3, the data acquisition channel 40 according to one embodiment of the invention includes a preamplifier 42, which is operatively connected to the first and second detector signal lines 21, 23 from one of the detectors 20. The preamplifier has an output operatively connected to a voltage divider 44, which in turn has an output operatively connected to the input of a sigma-delta modulator 46. A decimator 48 has input operatively connected to the output of the sigma-delta modulator, as well as a convert input operatively connected to the convert line 32 of the position sensor 18. It also has a digital parallel output operatively connected to a serial input of an output shift register 50.

The preamplifier 42 is a transresistance operational amplifier circuit. It includes an operational amplifier 52 with a non-inverting input line 54, which is operatively connected to ground and to the cathode of the detector via the second detector signal line 23. The preamplifier also has an inverting input line 56, which is operatively connected to the anode of the detector via the first detector signal line 21. An output line 57 of the operational amplifier serves as the output line of the preamplifier. It is also operatively connected to its non-inverting input line through a feedback resistor 58.

In one embodiment the detectors 20 are capable of providing a one microampere full-scale current. The operational amplifier 52 is an AD822 operational amplifier, which is available from Analog Devices, Inc. of Norwood, Mass., powered by a +5 volt positive supply rail 59 and a −12 volt negative supply rail 61. The feedback resistor has a resistance of nominally 10 megaohms, or even as much as 20 megaohms.

The voltage divider 44 includes an input resistor 60 with a terminal connected to the output line of the preamplifier 42 and another terminal connected to a terminal of a grounding resistor 62. The other terminal of the grounding resistor is grounded, and the node between the two voltage divider resistors 60, 62 serves as the output line of the voltage divider. Typical values for these resistors are 6 kiloohms for the input resistor and 4 kiloohms for the grounding resistor. They are on-chip thin-film resistors built into a CMOS or BiCMOS integrated circuit that also includes the sigma-delta modulator 46. The thin film resistors are implemented in additional steps over those required to implement the CMOS or BiCMOS integrated circuit. Note that the stability of the ratio between the resistances of these resistors is generally more important than their actual values.

The sigma-delta modulator 46 can be a third order oversampling switched-capacitor sigma-delta modulator circuit. It includes a first summer 64, which has a non-inverting input line operatively connected to the output of the voltage divider and an inverting input line operatively connected to a modulator feedback line 81. First, second, and third serially connected integrators 66, 68, 70 follow this summer. These three integrators each have an output line that is provided to one of three inputs of a second summer 78 via respective first, second, and third gain elements 72, 74, 76. In this embodiment, the first gain element 72 multiplies the output of the first integrator 66 by a factor of 0.863. The second gain element 74 multiplies the output of the second integrator 68 by a factor of 0.335. The third gain element 76 multiplies the output of the third integrator 70 by a factor of 0.0556.

The second summer 78 provides its weighted sum on an output line operatively connected to an input line of a one-bit analog-to-digital converter (ADC) 80. An output line of the ADC serves as the output line of the sigma-delta modulator 46, and it is also operatively connected to an input of a one-bit digital-to-analog converter (DAC) 82. The DAC has an output line operatively connected to the modulator feedback line 81.

The sigma-delta modulator also includes reset circuitry 79, which monitors the output of the third integrator 70 and the output of the analog-to-digital converter 80. If the integrator output exceeds the supply voltage of the sigma-delta modulator, or if the output of the modulator exhibits anomalous outputs, this circuitry resets the sigma-delta modulator to a stable state. The reset circuitry detects unstable states during power-up operation. It is contemplated that the reset circuitry will never be needed during operation, except during power-up, as CT scanning applications generally do not tolerate data loss during operation.

In this embodiment, there are four separate voltage dividers and four separate corresponding sigma-delta modulators, such as the ones described, on a single integrated circuit. This integrated circuit can be powered by a +5 volt positive supply rail 69, and a −5 volt negative supply rail 71 and can be clocked at a nominal rate of 2.56 MHz. Its four separate voltage dividers can be connected to preamplifiers for four of the detectors 20 in the CT scanning system 10. Design techniques described in the above referenced commonly assigned application entitled SWITCHED-CAPACITOR OFFSET SUPPRESSION can be used in implementing this integrated circuit.

The decimator 48 includes first and second accumulators 84, 86, which each have ADD/SUBTRACT inputs 83, 85 operatively connected to the output line of the sigma-delta modulator 46. The first accumulator 84 has a non-inverting input 87, which is operatively connected to an output line of a ROM 88. A first inverter 90 also has an input operatively connected to the output line of the ROM, and has an output operatively connected to a non-inverting input 89 of the second accumulator 86. The first accumulator has a sum output line 91 operatively connected to the first data input line 95 of a multiplexer 92, and the second accumulator has a sum output line 93 operatively connected to the second data input line 97 of the multiplexer. The multiplexer has a data output line 98, which acts as the data output line of the decimator.

The decimator 48 further includes an address counter 100, which has a count output 102 that provides addresses to the ROM 88, and a DONE output 104 that serves as another output of the decimator 48. The DONE output line is enabled when the address counter has reached either its maximum or minimum count. The counter also has an UP/DOWN input 106 connected to the output line of a toggle flip-flop 108.

The toggle flip-flop 108 has an input line operatively connected to the convert line 32 of the position sensor 18 in the CT-scanner 10. The flip-flop provides its output line to the counter, to the select input 111 of the multiplexer 92, to a first input of a first AND gate 110, and to an input line of a second inverter 112. The second inverter provides an inverted version of the flip-flop output on its output line, which is operatively connected to the first input line of a second AND gate 114. A second input line of each of the first and second AND gates is operatively connected to the convert line. The output lines of the first and second AND gates are operatively connected respectively to first and second clear inputs 113, 115 of the first and second accumulators 84, 86.

The output shift register 50 has a parallel input line 116, which is operatively connected to the parallel output line of the decimator 48. In this embodiment, each decimator channel provides a 24-bit parallel output line to its output shift register. The shift register also includes a serial input 120, a serial output 122, and a load control input 118. The load control input line is operatively connected to the DONE output line from the address counter 100.

An interval counter 107 has a start input line operatively connected to the convert line 32. It also has an output 109, which is provided to the output shift register 50. It is an up-counter that is clocked at the modulator sampling rate.

Sixteen decimators and shift registers such as the ones shown in FIG. 2 can be implemented on a single 16-channel CMOS integrated circuit. In this integrated circuit, the address counter 100, the toggle flip-flop 108, the ROM 88, the first inverter 90, the second inverter 112, and the two AND gates 110, 114 are shared among all sixteen decimators. Each of the decimators has its own two accumulators 84, 86, multiplexer 92, and shift register 50.

The shift registers on each integrated circuit are "daisy-chained" together via their serial inputs and outputs. The 16-channel integrated circuit therefore only has one serial input and one serial output. If necessary, the designer of a data acquisition system can also daisy-chain the serial inputs and outputs of several of the decimator integrated circuits together. In this way, the system designer can provide one or more serial digital outputs for a complete data acquisition system.

Operation of the acquisition channel 40 of FIG. 2 in connection with the CT scanning system 10 of FIG. 1 will now be discussed. The detector 20 for the channel 40 shown in FIG. 2 receives a small portion, or beam, of the x-rays emitted by the x-ray source and transmitted through the patient. The intensity of each received x-ray beam depends on the patient's anatomical features in the path of that beam. The detector converts this intensity into a current of up to about one microampere, and the preamplifier 42 then translates the current into a voltage that is proportional to it. The gain of this transresistance amplification is dependent on the value of the feedback resistor Ribner et al. propose providing a preamplifier output voltage directly to a sigma-delta modulator in U.S. Pat. No. 5,142,286. In this embodiment of the present invention, however, the preamplifier 42 receives a different power supply voltage than the sigma-delta modulator 46, and has a voltage divider connected between the preamplifier and the sigma-delta modulator. This configuration actually reduces noise in the input stage of the circuit and improves dynamic range of the acquisition channel.

These improvements arise because the voltage divider 44 allows for the use of a larger feedback resistor 58, which is a noise source that limits the dynamic range performance of the channel. Although this larger resistor generates additional thermal noise, it also increases preamplifier gain, and the gain increase outweighs the noise increase. Once the voltage divider has divided the preamplified voltage down to levels suitable for operation of the sigma-delta modulator, therefore, the resistor noise is at a lower level than it would have been with a smaller preamplifier resistor and a direct connection between the preamplifier and the modulator.

More particularly, the input noise voltage is given by:

$$\overline{v_n} = \sqrt{4kTRf_{BW}}$$

where k is the Boltzmann constant, T is the temperature in Kelvin, R is the feedback resistance value, and $f_{BW}$ is the bandwidth of interest. If the feedback resistor R were to be doubled, for example, equation 1 indicates that the noise voltage $\overline{v_n}$ will increase by a factor of √2. But the signal voltage at the preamplifier output is increased by a factor of 2. The net signal-to-noise ratio is therefore improved by a factor of √2. Operating the preamplifier with higher voltages also reduces the contribution of the operational amplifier's input offset in the preamplifier output, while running the switched-capacitor circuit at five volts may allow the circuit to be implemented using a process that can allow it to switch at a higher speed. And because the voltage divider 44 resistors are implemented on the same integrated circuit as the sigma-delta modulator 46, the signal-to-noise ratio improvement is achieved with little impact on per channel circuit board real estate, parts, and associated assembly costs.

Resistor values for the voltage divider should be chosen such that the maximum output voltage of the preamplifier 42 does not exceed the maximum input voltage that the sigma-delta modulator 46 can accommodate. Otherwise, any excess voltage at the input of the modulator could cause instability in the modulator. This can be important in systems that employ x-rays because they can introduce spikes into the preamplifier.

In addition, the temperature coefficients of the voltage divider 44 resistors 60, 62 should be well matched. This is because the digital signal processing stage 26 cannot compensate for gain drift. And the nature of the CT scanning application leaves no time for periodic calibration during scans. The matching of temperature coefficients can be achieved with precision thin film resistors and ordinary layout precautions, such as orienting resistors in the same direction and placing them close to each other. In the present embodiment, such techniques have enabled the drift of the voltage divider ratio to be below 5 ppm/° C.

The sigma-delta modulator 46 performs a third order modulation operation on the output of the voltage divider 44, according to the modulator coefficients 72, 74, 76, and it provides a one-bit digital output data stream to the decimator 48. For a discussion of third order sigma-delta modulator design, see Chao et al., "A Higher Order Topology for Interpolative Modulators for Oversampling A/D Converters", *IEEE Transactions on Circuits and Systems*, Vol. CAS-37, pp. 309–318, March 1990. The use of a third order single-bit modulator is desirable because it requires only a small amount of analog circuitry, it has good linearity, and it allows for low decimation filter complexity due to its one-bit modulator outputs.

The decimator 48 implements an approximation to the first order sinc filter that is desired for CT. The time-domain response of this decimator is shown as the top trace 134 of FIG. 3. This time-domain response differs from an ideal sinc filter in that its rising and falling ends 130, 132 are significantly rounded, instead of being rectangular. These ends are rounded enough to provide the decimator with a sharper roll-off at high frequencies, which allows it to remove substantially all high frequency quantization noises unlike an ideal first-order sinc filter. Low frequency response (below and around the sinc roll-off frequency) is not significantly affected by this rounding, so it does not tend to adversely affect the generally low-frequency CT signals. In this embodiment, quantization noise is removed to the eighteenth bit level, but other characteristics for the filter are also possible.

The decimator 48 has a variable length conversion interval that is timed by the convert signal. To achieve this variable length conversion interval, the time-domain response of the decimator is divided into a first rounded rising phase 136, a second plateau phase 138, and a third rounded falling phase 140, with the second phase being variable in length. This variable length conversion interval results in a group delay error, but the digital signal processing stage 26 can compensate for this based on the output of the interval counter.

The convert line 32 marks the start of the first phase 136 of the conversion interval. When the decimator 48 receives convert pulses on the convert line, the toggle flip-flop 108 toggles back and forth between a logic low and a logic high. In the case where a convert pulse 36 causes the flip-flop to go from a logic low to a logic high, the first AND gate 110 provides a logic high on the clear input 113 of the first accumulator 84, clearing it to zero. The positive going transition on the output of the flip-flop also causes the address counter 100 to start incrementing from zero.

The address counter 100, which is clocked by the same clock as the sigma-delta modulator 46, provides a sequence of successively increasing addresses to the ROM 88. This causes the ROM to retrieve a series of stored filter coefficients for the first phase 136 of the time-domain response, and provide them in succession to the input 87 of the first accumulator 84. The first accumulator either adds or subtracts each of these filter coefficient from a running sum it maintains, depending on whether the modulator is providing a high or a low input to its ADD/SUBTRACT input line 83.

When the address counter 100 reaches its maximum count value, the second phase 138 begins. During this second phase, the first accumulator 84 continues its adding and inverting, but uses the same coefficient value for these operations. The filter remains in the second phase until the next convert pulse 38.

When the next convert pulse 38 occurs, the flip-flop 108 output goes low, which causes the address counter 100 to provide a stream of successively decrementing counts on its output 102. The ROM 88 uses these counts to again retrieve its coefficients, but this time in reverse order. Once the address counter reaches zero, the third phase 140 is complete, and the DONE output 104 of the address counter generates a DONE pulse. This DONE pulse actuates the load input 118 of the output shift register 50, causing it to load the value at the output 91 of the first accumulator 84 via the multiplexer 92.

The convert pulse 38 that signals the start of the third phase 140 of the current cycle also initiates the first phase of the next conversion cycle. This next conversion cycle is similar to the first conversion cycle, except that it uses the second accumulator 86 instead of the first accumulator 84. At the end of the next conversion cycle, another DONE pulse will cause the output shift register 50 to load the value from the second accumulator 86. This interleaved operation is repeated continuously during the conversion of signals.

Each location in the ROM 88 holds a filter coefficient that one of the accumulators can use directly. The other accumulator can use an inverted version of this coefficient at the same time, because the rising and falling ends 130, 132 of the decimator response are axially symmetrical. This allows both channels to operate off of a single ROM, which reduces the complexity of the resulting circuit. Appropriate ROM coefficients can be obtained by convolution of an ideal CT sinc filter with a low pass filter. For example, if the output rate is 2.5 KHz, ROM coefficients can be obtained by convolving a 1.25 KHz sinc filter with a fourth order low pass filter having a 5 KHz corner frequency.

The interval counter 107 is used to determine the actual length of the entire integrator intervals. It provides a duration value for each variable length integration interval to the output shift register 50. The digital signal processing stage 26 can then normalize the measurement values by dividing them by the duration values to obtain a normalized intensity, which is independent of variations in the conversion interval. In this embodiment, the sigma-delta modulator 46 is clocked with a 2.56 MHz clock, and the nominal convert frequency is 2.56 kilohertz, resulting in a variable decimation ratio centered at 1024X.

The decimator 48 is advantageous in that it is immune to jitter and other variations in the timing of the convert pulses from the CT scanning system. This is important in CT scanning systems because their convert pulses can have up to 20% timing uncertainties caused by a variety of factors such as motor speed variations. And since the extent of conversion interval variations tolerable using this approach is limited only by the number of bits in the data paths, these variations can be made arbitrarily large. This allows the CT scanning system to use relaxed motor speed control requirements and may thereby reduce its cost.

It is particularly advantageous that the decimator achieves its immunity without complex frequency-locked circuitry. Certain prior art approaches require a complicated frequency-locked timing subsystem because they employ fixed decimation ratios. The approach in this embodiment overcomes this limitation and allows the system clock to be fixed and independent. The decimator in this embodiment, for example, only needs a simple and inexpensive quartz crystal oscillator to generate its clock signal.

The decimator 48 is also efficient to implement, as it requires only approximately two parallel adders and accumulators per channel. This is particularly important for a CT scanning system, which can employ 1,000 or more channels.

Figure 4:
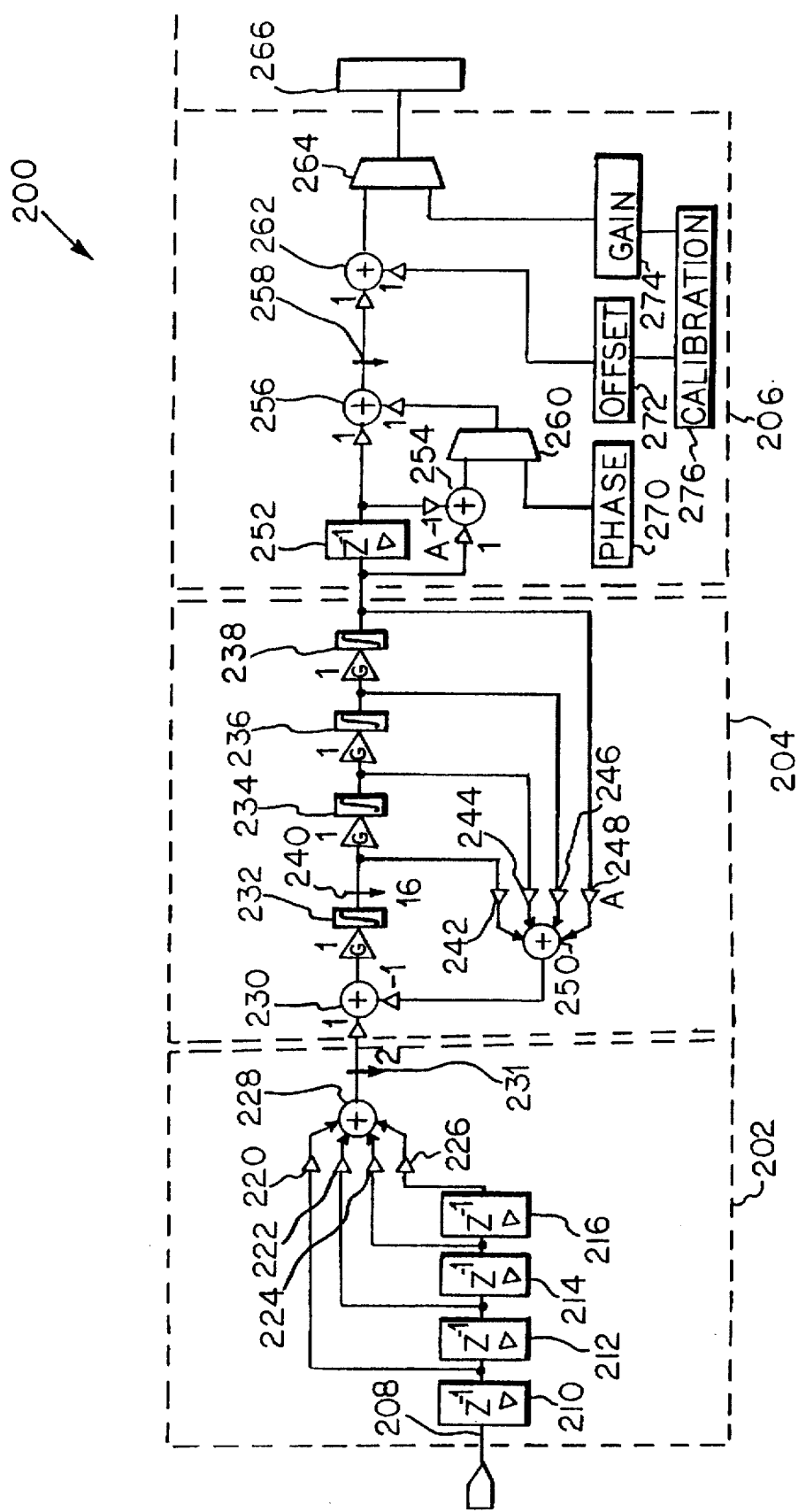
FIG. 4 is a block diagram of a decimator for use in an active filter mode data acquisition channel, which decimator can be substituted for the decimator in the acquisition channel of FIG. 2.

Unlike the above embodiment which implements a so-called integrating mode signal processing, the CT scanning system shown in FIG. 4 provides an active signal processing system. This embodiment employs a novel IIR decimation filter, which is discussed in more detail in the above-referenced application entitled MULTI-RATE IIR DECIMATION AND INTERPOLATION FILTERS. This IIR filtering permits an alternative approach to dealing with variations in the timing of the convert pulses from the CT scanning system.

Referring to FIG. 4, an active filter decimator 200 includes a 4-tap FIR (Finite Impulse Response) filter 202, followed by an improved IIR filter 204, which is in turn followed by a linear interpolator 206. The FIR filter is a simple 4-tap implementation of a sinc$^3$ filter, with a decimation ratio of 2. The input line 208 of this filter forms the input line of the decimator. This input is operatively connected to an input of a first delay element 210. A first FIR gain element 220 has an input operatively connected to an output of the first delay element, and an output operatively connected to a first non-inverting input of a first summer 228. A second delay element 212 has an input that is also operatively connected to the output of the first delay element. A second FIR gain element 222 has an input operatively connected to an output of the second delay element, and an output operatively connected to a second non-inverting input of the first summer. Similarly, a third delay element 214 has an input operatively connected to the output of the second delay element and an output operatively connected to an input of a fourth delay element 216. A third gain element 224 has an input operatively connected to the output of the third delay element, and an output operatively connected to a third non-inverting input of the first summer. A fourth gain element 226 has an input operatively connected to an output of the fourth delay element, and an output operatively connected to a fourth non-inverting input of the first summer. The summer also has an output, which is operatively connected to an input of a decimator 231. The decimator has an output, which acts as an output of the FIR filter.

In one embodiment, the first gain element has a gain of 0.125, the second gain element has a gain of 0.375, the third gain element has a gain of 0.375, and the fourth gain element has a gain of 0.25. The decimator has a decimation ratio of 2 in this embodiment.

The IIR filter 204 is a fourth-order IIR decimation filter, which is discussed in more detail in the above-referenced copending application entitled MULTI-RATE IIR DECIMATION AND INTERPOLATION FILTERS. It includes a second summer 230 that has a non-inverting input that is operatively connected to the output of the decimator 231. An output of the second summer is operatively connected to an input of a first integrator 232, and an output of this integrator is operatively connected to an input of a first decimator 240. A first gain element 242 has an input operatively connected to the output of the first decimator and an output operatively connected to a non-inverting input of a third summer 250. The third summer has an output that is operatively connected to a inverting input of the second summer.

Also operatively connected to the output of the first summer are three further integrators 234, 236, 238. In particular, the second integrator 234 has an input operatively connected to an output of the first decimator 240, and an output operatively connected to a second non-inverting input of the third summer 250 via a second gain element 244. Similarly, the third integrator 236 has an input operatively connected to an output of the second integrator, and an output operatively connected to a third non-inverting input of the third summer via a third gain element 246. The fourth integrator 238 has an input operatively connected to an output of the third integrator, and an output operatively connected to a fourth non-inverting input of the third summer via a fourth gain element 248. The output of the fourth integrator also forms the output of the IIR filter 204.

In one embodiment, the decimation ratio of the first decimator 240 is 16. The second, third, and fourth integrators do not have decimators at their respective outputs, although in other embodiments, such decimators could be provided. Decimation is not used after the second, third, and fourth integrators 234, 236, 238 because the CT DAS application makes this difficult without more elaborate computation in the post-processing, as will be explained below. The total decimation from the modular output to the IIR filter output is 32X. The gain of the first gain element 242 is $3.92398 \times 10^{-3}$, the gain of the second gain element 244 is $4.69404 \times 10^{-6}$, the gain of the third gain element 246 is $3.05644 \times 10^{-9}$ and the gain of the fourth gain element 248 is $9.78106 \times 10^{-13}$.

In practice it is preferable to provide some gain in the integrators 232, 234, 236, 238 themselves to compensate for the incremental decimation operations and maintain maximum dynamic range with minimum word widths without affecting overall frequency response characteristics. Providing this gain in the integrators will impact the gain values of the gain elements 242, 244, 246, 248.

The IIR filter 204 has properties of a conventional fourth-order, low pass state-variable filter. This IIR filter takes advantage of the fact that at the output of each integrator stage, the signal is low pass filtered and therefore can be decimated. This property allows the decimation process to be embedded within the IIR filter.

In addition, the multiplications with the IIR filter coefficients, which can constitute a major computation load for IIR filters, can be performed at decimated rates, with only the first stage integrator needing to operate at the full input data rate. The entire IIR decimation filter can be implemented with as few as 2 equivalent adds per channel per input sample, which can be at least a factor of 2 more efficient than a single-stage FIR decimation filter. This efficient implementation can be quite advantageous in CT-scanning systems, which have a high number of channels.

The interpolator 206 includes a fifth delay element 252 that has an input operatively connected to the output of the IIR filter 204. It also includes a fourth summer 254 that has a non-inverting input operatively connected to the input of the fifth delay element 252, and a inverting input operatively connected to the output of the fifth delay element. The output of the fifth delay element is also operatively connected to a non-inverting input of a fifth summer 256. The fifth summer has a second non-inverting input that is operatively connected to an output of a first multiplier 260, and an output operatively connected to the input of a gate 258, which has an enable input operatively connected to the convert line 32. This gate has an output operatively connected to a non-inverting input of a sixth summer 262. The sixth summer has an output operatively connected to a first input of a second multiplier 264, which has an output to an input of an output shift register 266.

The first multiplier 260 has one input operatively connected to an output of the fourth summer 254, and a second input operatively connected to an output of a phase register 270. An offset register 272 has an output operatively connected to a non-inverting input of the sixth summer 262. A gain register 274 has an output operatively connected to a second input of the second multiplier. The gain and offset registers obtain calibration values from calibration circuitry 276, which performs periodic calibration of the channels in order to normalize the relative zero and full scale performance of all the channels in the DAS. In some systems, the gain and offset normalization function is performed by the digital signal processor 26. The phase register includes counting circuitry that is clocked at the modulator sampling frequency. This clocking circuitry includes a reset circuit that resets its count in response to the output sampling rate of the decimator, and an output latch that is controlled by the convert signal. In one embodiment where the overall decimation factor is 32X, the phase register is a 5 bit counting register.

Figure 5:
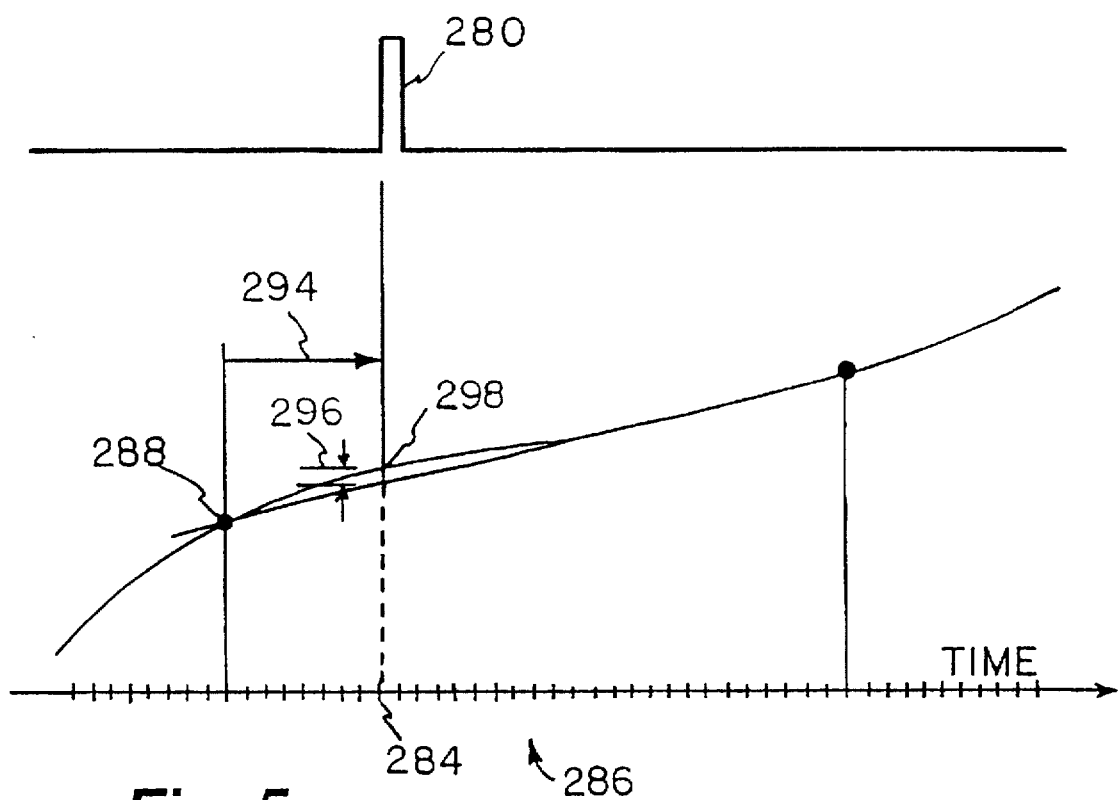
FIG. 5 is an illustrative plot that shows an ideal IIR (Infinite Impulse response) filter output for the decimator of FIG. 4, an approximate interpolated output of the decimator of FIG. 4, and a convert signal with an illustrative convert pulse shown in time alignment with the interpolator output.

Referring also to FIG. 5, the interpolator 206 provides an output that approximates an undecimated filter output by interpolating the output of the IIR filter to the sampling rate of the modulator 200. The interpolator performs a linear interpolation of the two most recent IIR filter samples. In particular, when a convert pulse 280 is detected, the phase register 270 latches in the closest 284 of the 32 possible phases 286 during which the convert pulse was detected. The fourth summer then subtracts the previous IIR filter output 288, which it obtains at the output of the fifth delay element 252, from the most recent IIR filter output 290, which it obtains from the input of the fifth delay element 252. The first multiplier 260 takes the resulting difference 294 and scales it by the value of the phase register divided by the number of possible phases. The fifth summer 256 adds the resulting scaled output to the previous IIR filter output to obtain an approximated value to an undecimated filter output at the time of the convert signal.

The linear approximation can have an error 296 by which it differs from an ideal value 298. In the one embodiment for which specific numbers are provided above, the linear approximation is accurate to within 0.5 ppm of full-scale for a worst case signal. This level of error should cause no noticeable degradation to the data acquisition system measurements. Increasing the IIR decimation ratio beyond 32X may substantially increase the linear approximation error, which could require a much more complex second-order interpolation to minimize.

Figure 6:
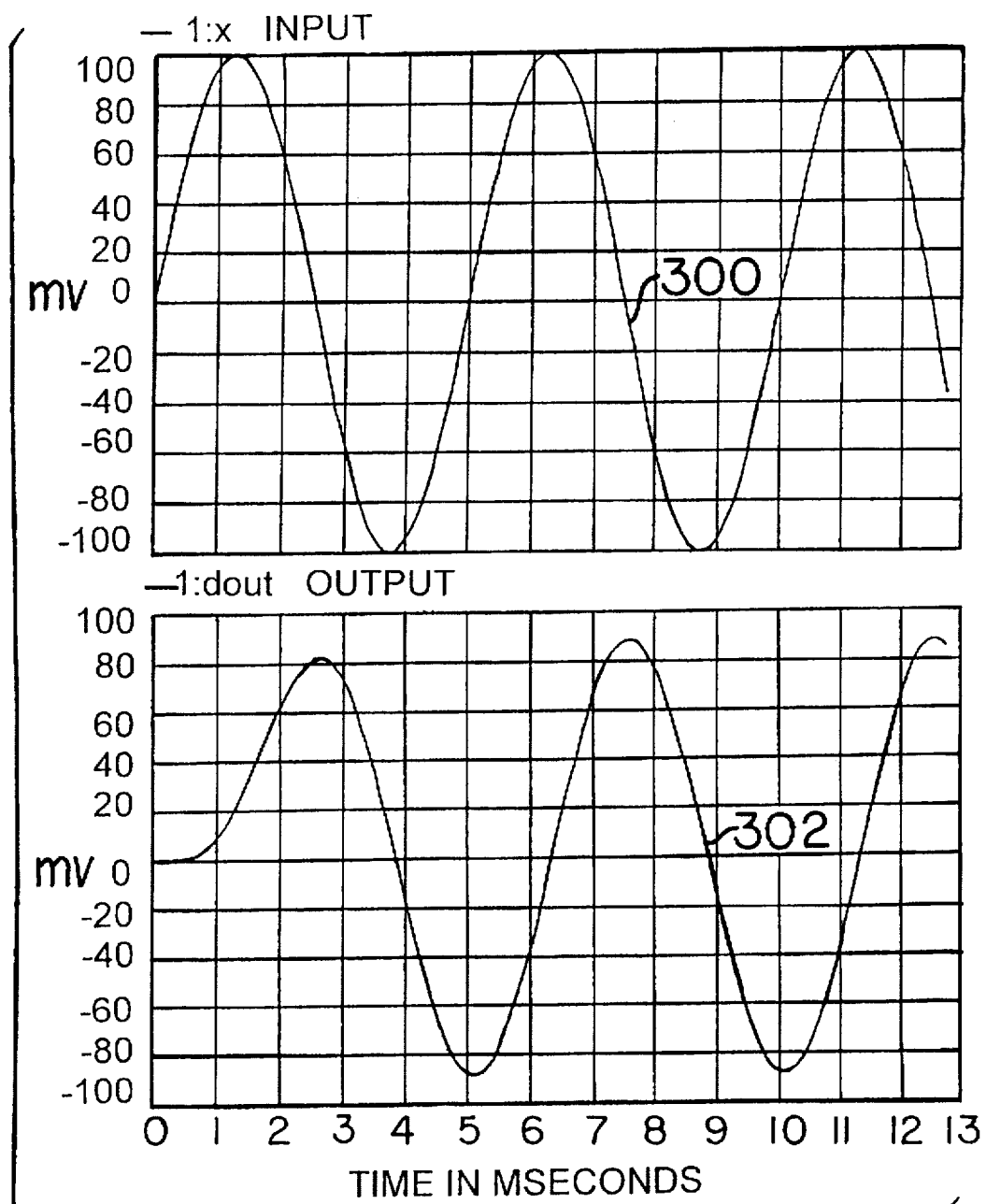
FIG. 6 is a plot of a simulated input signal for a simulation of a system similar to that shown in FIG. 2 with the decimator of FIG. 4 substituted for its decimator, and a simulated output signal shown in alignment with the input signal.

Referring also to FIGS. 6, simulations were performed for the channel 40 of FIG. 2 with the active filter mode decimator of FIG. 4 substituted for the integrating filter mode decimator 48 of FIG. 2. The sampling frequency used for the simulation was 2.56 MHz. One simulation was performed with a 200 Hz sine wave input signal 300.

As can be seen from the simulated output signal 302, the out-of-band quantization noise from the sigma-delta modulator is effectively removed by the decimator 200 in this simulation. Group delay of the IIR filter is evident in the delay between the input and output wave forms. Additional simulations have indicated that the low-pass frequency characteristic of the IIR filter 204 is not adversely impacted by the decimation within the IIR filter. Several active filter mode decimators 200 can be implemented as dedicated digital circuitry on a single integrated circuit.

The above embodiments discuss a chip set for use in CT scanning system data acquisition channels. Of course, a designer may also obtain benefits from the circuitry and concepts of the invention, without implementing them as integrated circuits. Furthermore, one skilled in the art will realize that parts of the circuitry could be implemented in different, but equivalent ways. For example, dedicated processing circuitry, microprogrammed processing circuitry, or general purpose processing circuitry running special purpose software could be used to implement the embodiment described. In addition, it will be apparent that some digitally-implemented functionality is equivalent to analog-implemented functionality.

It is contemplated that the above-described circuitry could be adapted to service CT scanning systems that employ multiple asynchronous convert signals for each channel. It is also possible to perform the both active and integrating signal processing operations a compound using a same integrated circuit that shares circuitry between modes. This integrated circuit could then be employed for both types of systems. Currently, however, applicants contemplate separate chip sets for each type of operation.

In addition, acquisition channels according to the invention can find application in other areas. For example, electrocardiogram (EKG) monitoring, electroencephalagram (EEG) monitoring, seismic detection, and chemical analysis should benefit, because of their requirement for large numbers of analog-to-digital conversion channels. Applications that require detection of small current signals can also benefit from the improved dynamic range of the channels according to the invention.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A computed tomography scanning system, comprising:

an x-ray source, a plurality of x-ray detectors positioned to receive x-rays from the x-ray source, a position sensor responsive to a position of the x-ray source relative to the x-ray detectors, a plurality of sigma-delta modulators each having an input operatively connected to an output of one of the x-ray detectors, a plurality of decimator portions each having a modulated detector signal input operatively connected to an output of one of the modulators, the decimator portions each having a convert signal input operatively connected to an output of the position sensor and having a clock signal input, wherein the decimator portions are each responsive to a convert signal on the convert signal input to define a decimation period during which each decimator decimates a modulated detector signal on the modulated detector signal input based on a clock signal on the clock line, a digital signal processing stage responsive to outputs of the decimator portions, and having a display output, and a display responsive to the digital signal processing stage.

2. The apparatus of claim 1 wherein the decimator portions are part of a single semiconductor structure.

3. The apparatus of claim 1 wherein the decimator portions each further comprise a first accumulator having an add/subtract line operatively connected to the input of that decimator portion, the first accumulator having an output operatively connected to an output of that decimator portion via a circuit path, a coefficient source having a coefficient output operatively connected to a data input of each of the first accumulators, and a second accumulator having an add/subtract line operatively connected to the input of that decimator portion, wherein the coefficient output of the coefficient source is operatively connected to a data input of each of the second accumulators, and wherein each of the decimator portions further comprises a multiplexer having a first data input operatively connected in the circuit path to the output of the first accumulator of that decimator portion and a second data input operatively connected to an output of the second accumulator of that decimator portion, and wherein each of the first and second accumulators has a clear input responsive to the convert signal input of that decimator.

4. The apparatus of claim 6 wherein the coefficient source includes a read-only memory having a data output operatively connected to the coefficient source output.

5. The apparatus of claim 4 wherein the decimator portions each have a rectangular time domain response with rounded rising and falling ends, wherein the ends are rounded such that substantially all high frequency quantization noise from the modulator is removed, and wherein the rising end is axially symmetrical with respect to the falling end.

6. The apparatus of claim 4 wherein the decimator portions have a time domain response that corresponds to convolution of a sinc function with a low pass function.

7. The apparatus of claim 3 further including a flip-flop having an input operatively connected to a convert signal input and an output operatively connected to a select input of each of the multiplexers.

8. The apparatus of claim 1 wherein the decimator portions each have a rectangular time domain response with significantly rounded rising and falling ends, wherein the ends are rounded enough to remove substantially all high frequency quantization noise from the modulator, and wherein the rising end is axially symmetrical with respect to the falling end.

9. The apparatus of claim 1 wherein the decimator portions have a time domain response that corresponds to convolution of a sinc function with a low pass function.

10. A computed tomography imaging method, comprising:

receiving an analog beam intensity signal from a computed tomography scanner, converting the analog beam intensity signal into a series of digital representations of the analog beam intensity signal at successive points in time using a predetermined sample rate, receiving at particular points in time indications that a portion of the scanner has reached a certain position relative to the beam, the indications being received asynchronously with respect to the sample rate, and adjusting the value of at least one of the digital representations in response to the indications to obtain a corrected digital representation of the analog signal at that particular point in time.

11. The method of claim 10 wherein the step of adjusting includes a step of linearly interpolating between two of the digital representations to obtain the corrected digital representation.

12. The method of claim 11 wherein the step of converting employs an infinite impulse response filter.

13. The method of claim 10 wherein the step of converting employs a variable length conversion interval, and wherein the step of adjusting adjusts the value of the one of the digital representations based on a length of the variable conversion interval.

14. The method of claim 10 wherein the step of converting includes a step of decimating according to a rectangular time domain response with significantly rounded rising and falling ends, wherein the ends are rounded such that substantially all high frequency quantization noise from the modulator is removed, and wherein the rising end is axially symmetrical with respect to the falling end.

15. The method of claim 10 wherein the step of converting includes a step of decimating according to a time domain response that corresponds to a convolution of a sinc function with a low pass function.

16. The method of claim 10 wherein the step of converting includes a first step of decimating, further including a second step of receiving, and further including the step of initiating and terminating the step of decimating in response to the steps of receiving.

17. The method of claim 16 wherein the step of converting further includes a second step of decimating, and wherein the first and second steps of decimating overlap in time.

18. The method of claim 17 further including the step of providing a weighting value, and wherein the first and second steps of decimating simultaneously respond to the weighting value to determine a coefficient to be applied to a modulated version of the analog beam intensity signal.

19. An analog-to-digital converter, comprising:

a sigma-delta modulator, a convert signal line, a decimator having a data input operatively connected to an output of the modulator and a control input operatively connected to the convert signal line, the decimator having a variable decimation ratio timed by a signal on the convert signal line on a sample-by-sample basis, and a decimation period timer operatively connected to the convert signal line.

20. The apparatus of claim 19 wherein the decimator has a rectangular time domain response with significantly rounded rising and falling ends, wherein the ends are rounded such that substantially all high frequency quantization noise from the modulator is removed, and wherein the rising end is axially symmetrical with respect to the falling end.

21. The apparatus of claim 19 wherein the decimator has time domain response that corresponds to a convolution of a sinc function with a low pass function.

22. The apparatus of claim 19 wherein the sigma-delta modulator is a third-order sigma-delta modulator.

23. A computed tomography scanning system, comprising:

an x-ray source, a plurality of x-ray detectors positioned to receive x-rays from the x-ray source, a plurality of sigma-delta modulators each being responsive to one of the x-ray detectors, a convert signal line, a plurality of decimators each having a data input operatively connected to an output of one of the modulators and a control input operatively connected to the convert signal line, the modulators having a variable decimation ratio timed by a signal on the convert signal line on a sample-by-sample basis, a decimation period timer operatively connected to the convert signal line, a digital signal processing stage responsive to the output of the decimators and the decimation period timer, and having a display output, and a display responsive to the digital signal processing stage.

24. The apparatus of claim 23 wherein the decimators have a rectangular time domain response with rounded rising and falling ends, and wherein the rounded ends are axially symmetrical.

25. The apparatus of claim 23 wherein the decimators have a time domain response that corresponds to a convolution of a sinc function with a low pass function.

26. The apparatus of claim 23 wherein the sigma-delta modulators are third-order sigma-delta modulator.

27. A computed tomography imaging method, comprising:

sigma-delta modulating an analog beam intensity signal to obtain a modulated version of the analog beam intensity signal, and decimating the modulated version of the analog beam intensity signal according to a variable-length rectangular time domain response with significantly rounded rising and falling ends, wherein the period between the rounded ends is variable on a sample-by-sample basis, and wherein the ends are rounded such that substantially all high frequency quantization noise from the modulator is removed.

28. The method of claim 27 wherein the step of decimating is performed with the rising rounded end being axially symmetrical with respect to the falling end.

29. The method of claim 27 wherein the step of decimating is performed with the time domain response corresponding to a convolution of a sinc function with a low pass function.

30. The method of claim 27 wherein the step of decimating lasts a first amount of time, further including a step of again decimating the modulated version of the analog version of the beam intensity signal according to the rectangular transfer function, wherein the step of again decimating lasts a second amount of time, and wherein the first and second amounts of time are different.

31. The method of claim 27 further including the step of again decimating the modulated version of the analog beam intensity signal according to the rectangular transfer function, wherein the step of again decimating overlaps with the step of decimating.

32. An analog-to-digital converter, comprising:

a transimpedance amplifier having a current input, an amplified voltage output, and a power supply input responsive to a first power supply voltage, wherein the transimpedance amplifier includes an operational amplifier coupled with a feedback resistor of above at least 10 megaohms in resistance, a sigma-delta conversion circuit having an input responsive to the output of the transimpedance amplifier, and a power supply input responsive to a second power supply voltage, the first power supply voltage being higher than the second power supply voltage, and a voltage divider connected in a signal path between the amplified output of the amplifier and the input of the circuit.

33. A computed tomography scanning system, comprising:

an x-ray source, a plurality of x-ray detectors positioned to receive x-rays from the x-ray source, a plurality of analog-to-digital converters each comprising:

a transimpedance amplifier having a current input, an amplified voltage output, and a power supply input responsive to a first power supply voltage, the current input of the transimpedance amplifier of each of the analog-to-digital converters being responsive to one of the detectors, the transimpedance amplifiers each an operational amplifier coupled with a feedback resistor of above at least 10 megaohms in resistance.

a modulator having an analog input responsive to the output of its respective amplifier, a power supply input responsive to a second power supply voltage, the first power supply voltage being higher than the second power supply voltage, and a digital output, and a voltage divider connected in a signal path between the amplified voltage output of the amplifier and the input of the modulator, a digital signal processing stage responsive to the output of the modulators, and having a display output, and a display responsive to the digital signal processing stage.

34. A computed tomography scanning system, comprising:

sensor means responsive to a position of an x-ray source relative to x-ray detectors, a plurality of sigma-delta modulators each having an input operatively connected to an output of one of the x-ray detectors, decimation means responsive to the modulators, to the sensor means, and to a clock signal, to define based on a signal from the sensor means a decimation period during which the decimator means decimate modulated detector signals from the modulators based on the clock signal, digital signal processing means responsive to the decimation means, and display means responsive to the digital signal processing means.

35. The apparatus of claim 34 further including means responsive to the clock signal for measuring the decimation period and for providing a resulting interval measurement to the digital signal processing means.

36. A computed tomography scanning system, comprising:

means for sigma-delta modulating an analog beam intensity signal to obtain a modulated version of the analog beam intensity signal, and means for decimating the modulated version of the analog beam intensity signal according to a variable-length rectangular time domain response with significantly rounded rising and falling ends, wherein the period between the rounded ends is variable on a sample-by-sample basis, and wherein the ends are rounded such that substantially all high frequency quantization noise from the modulator is removed.

37. The apparatus of claim 36 further including means for measuring the decimation period to enable correction of a result from the means for decimating.

* * * * *